United States Patent [19]

Van Rees et al.

[11] Patent Number: 4,745,448
[45] Date of Patent: May 17, 1988

[54] SEMICONDUCTOR DEVICES HAVING COMPENSATED BUFFER LAYERS

[75] Inventors: H. Barteld Van Rees, Newton Upper Falls; Barry J. Liles, Westboro, both of Mass.

[73] Assignee: Raytheon Company, Lexington, Mass.

[21] Appl. No.: 813,306

[22] Filed: Dec. 24, 1985

[51] Int. Cl.⁴ .................. H01L 29/80; H01L 29/167; H01L 29/207; H01L 29/227
[52] U.S. Cl. ...................................... 357/22; 357/61; 357/63; 357/64; 357/89; 357/90
[58] Field of Search .......... 357/63, 61, 22 A, 22 MD, 357/64, 89, 90, 22 R, 16; 252/62.3 GA

[56] References Cited

U.S. PATENT DOCUMENTS

| | | | |
|---|---|---|---|
| 3,344,071 | 9/1967 | Cronin | 252/62.3 GA |
| 3,994,755 | 11/1976 | Kamath et al. | 252/62.3 GA |
| 4,004,953 | 1/1977 | Otsubo et al. | 252/62.3 GA |
| 4,158,851 | 6/1979 | Akai et al. | 357/63 |
| 4,204,893 | 5/1980 | Cox . | |
| 4,279,670 | 7/1981 | Steele . | |
| 4,593,301 | 6/1986 | Inata et al. | 357/16 |
| 4,688,062 | 8/1987 | Liles | 357/22 |

FOREIGN PATENT DOCUMENTS 59-124771  7/1984  Japan .......................... 357/22 MD Primary Examiner—James Carroll
Assistant Examiner—Ngan Ngo
Attorney, Agent, or Firm—Denis G. Maloney; Richard M. Sharkansky

[57] ABSTRACT

A field effect transistor includes a substrate of gallium arsenide having a resistivity of at least about $10^7$ ohm/cm and a first buffer layer of gallium arsenide disposed over the substrate having a deep level acceptor dopant incorporated into the buffer layer to compensate for donor dopants incorporated into the buffer layer. The concentration of the donor dopants and the acceptor dopant are controlled to provide the buffer layer with a predetermined resistivity characteristic of about $10^7$–$10^8$ ohm/cm. The concentration of the deep acceptor dopant is substantially constant at about $10^{16}$ acceptors/cc throughout the first buffer layer. The buffer layer preferably has a thickness of at least 2 microns and preferably between 5 and 30 microns. A second buffer layer is disposed over the first buffer layer having a monotonically declining concentration of chromium dopant from about $10^{16}$ to less than about $10^{14}$ acceptors/cc. An active layer and contact layer of suitably n-type doped gallium arsenide are consecutively disposed over at least portions of the second buffer layer.

7 Claims, 3 Drawing Sheets

SEMICONDUCTOR DEVICES HAVING COMPENSATED BUFFER LAYERS

BACKGROUND OF THE INVENTION

This invention relates generally to semiconductor devices and, more particularly, to semiconductor devices having compensated buffer layers.

As is known in the art, semiconductor devices such as field effect transistors and monolithic microwave integrated circuits are often employed to amplify or process radio frequency signals. For example, a field effect transistor is often employed to convert D.C. power to radio frequency power by feeding an R.F. voltage signal to a gate electrode of the field effect transistor to thereby control the conductivity of an underlying drain-source channel of the field effect transistor.

Radio frequency performance from field effect transistors is dependent upon the quality of the crystalline structure of the semiconductor layers used to provide the field effect transistor. As is also known in the art, Group III-V semiconductor material systems such as systems employing gallium arsenide are often used to fabricate field effect transistors for amplifying or converting D.C. power to radio frequency and, in particular, microwave power. One technique used in the prior art to provide semiconductor layers for field effect transistors is to grow active regions directly over substrates of the Group III-V material. However, the crystalline quality of the substrates fabricated by any of the known methods is generally not suitable for fabrication directly thereon of high quality field effect transistors because in the crystal structure close to the surface of the substrate, unwanted crystalline defects such as hole and electron traps are present which can degrade the electrical properties of the device fabricated thereover. These traps can become ionized sites either accepting or emitting an electron. Thus, during operation of the field effect transistor, the electric field created by ionization of these traps will restrict the flow of electrons in the channel, an effect generally known in the art as "backgating" providing a concomitant loss in power.

One method known in the art for reducing this effect is to provide a buffer layer, comprising an epitaxially grown crystalline layer, intermediate the active regions of the semiconductor and the substrate. The buffer layer provides a high quality, high resistivity layer which shields or isolates the active region of the field effect transistor from the defects in the gallium arsenide crystal substrate. The buffer layer should preferably have a high resistivity and should also be relatively thick to adequately isolate or shield the active regions of the transistor from crystal defects present in the crystalline structure of the substrate.

Several methods have been suggested in the art to provide high resistivity buffer layers. These methods generally include the step of growing the epitaxial layer having a compensation dopant material introduced to maintain the high resistivity characteristics of the buffer layer. As shown in FIG. 1, Group III-V systems, for example, GaAs often have stoichiometric defects resulting from extra or interstitial As atoms. This type of stoichiometric defect generally referred to in the art as EL2 provides electron donor energy levels intermediate conduction and valence bands of the GaAs crystal. Also, certain impurities such as Si and S which are unintentionally introduced during growth of the GaAs layer provide shallow electron donor energy levels or energy levels just below the conduction band level of the crystal. Generally, this stoichiometric defect EL2, as well as, the impurities introduced during growth of the GaAs crystalline layer in the presence of an electron current flux provide donors of electrons and an electron current flow in the conduction band of the crystal. It is an object, therefore, to compensate for this electron current flow by providing a predetermined dopant concentration of an acceptor atom such as chromium which will provide in the presence of an electron current flux a hole current flow in the valence band of the crystal. This hole current flow in the valence band of the crystal compensates for electron flow in the conduction band of the crystal.

Generally, a dopant such as chromium is introduced during growth of the GaAs layer to provide acceptor energy levels to compensate for the donor energy levels. Chromium is a so-called deep level acceptor in GaAs. Chromium in GaAs provides an energy level which is intermediate the valence band energy level and the conduction band energy level of the GaAs. Chromium, when ionized accepts an electron from the valence band and provides a corresponding hole flow in the valence band of the crystal. Several problems occur with chromium dopant buffer layers, particularly when high concentrations of chromium are introduced into layers which are adjacent to the active layer of the field effect transistor. The rate of re-combination of electrons and holes between the valence band and intermediate deep energy level provided by the chromium may be lower than the rate of change of an injection current flux in the conduction band of the crystal. This lag in re-combination results in a net fixed negative charge of chromium ions in the crystal adjacent to the active layer. This fixed charge repels electrons in the channel of the device resulting in a loss of power. A second problem associated with chromium doping is that chromium has a tendency to slowly out-diffuse from the buffer layer into the active layer/buffer layer interface region resulting in a decrease in electron mobility and degraded device performance.

SUMMARY OF THE INVENTION

In accordance with the present invention, a semiconductor element such as a field effect transistor or a monolithic microwave integrated circuit includes first and second chromium doped Group III-V compensated buffer layers and a Group III-V active layer disposed over the second buffer layer. The first chromium doped compensated buffer layer has a thickness of typically 6 microns with the concentration of said chromium dopant as a function of thickness being substantially constant throughout said first buffer layer. The second buffer layer has a thickness of approximately 1 to 3 microns and is disposed over the first buffer layer. The concentration of dopant in the second buffer layer as a function of thickness is selected to decline, preferably monotonically decline from a relatively high concentration in a first portion of the second buffer layer adjacent to the compensated buffer layer to a relatively low concentration in a second portion of the second buffer layer adjacent to the active layers of the field effect transistor. The active regions and contact regions are then provided over the second buffer layer. With this arrangement, by providing such a buffer layer having a dopant concentration which declines as a function of thickness disposed between the fully compensated buffer layer and active regions of the field effect transistor, a diffusion shield is provided between active layers which provide the semiconductor element and the deep acceptor chromium doped region of the first buffer layer. This diffusion shield will aid in preventing back-gating in the transistor resulting from ionization of deep level acceptors. Further, the layer will reduce out-diffusion of chromium from the compensated buffer layer into active layers of the semiconductor device.

In accordance with a further aspect of the present invention, a semiconductor element such as a field effect transistor or a monolithic microwave integrated circuit includes a substrate comprising a Group III-V material having a resistivity of at least about $10^7$ ohm-cm. A first layer of a Group III-V material is disposed over said substrate to provide a compensated buffer layer. The layer of gallium arsenide is provided with a predetermined resistivity characteristic of about $10^7$ ohm-cm by introducing a dopant into said layer to compensate for donor dopants incorporated into the layer during growth of the layer. The dopant concentration profile of said layer has a first relatively large region of said layer having a substantially constant dopant concentration through said region of the layer of about $10^{16}$ acceptors/cc, and has a second depth portion having a linearly declining acceptor concentration through said second depth portion from about $10^{16}$ acceptors/cc to about $10^{14}$ acceptors/cc. Means are then provided over the Group III-V layer disposed adjacent the region where the deep acceptor concentration level is less than about $10^{14}$ acceptors/cc to provide the semiconductor element. With this arrangement, by providing a buffer layer region having a relatively low concentration of deep level acceptors, a diffusion shield is provided between the active regions of the semiconductor element and the deep level acceptor doped region of the buffer layer. This aids in reduction of back-gating and loss in power resulting from ionization of deep level acceptor states in response to an electron current flux generated in the active regions of the device. Concomitant therewith, there will be a reduction in out-diffusion of chromium from the compensated buffer layer into the active regions of the device and the resulting reduction in electron mobility caused by such out-diffusion. Preferably, the substrate and buffer layer materials and the active materials for the layers for the field effect transistor are comprised of gallium arsenide and the compensating dopant is chromium.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 2:
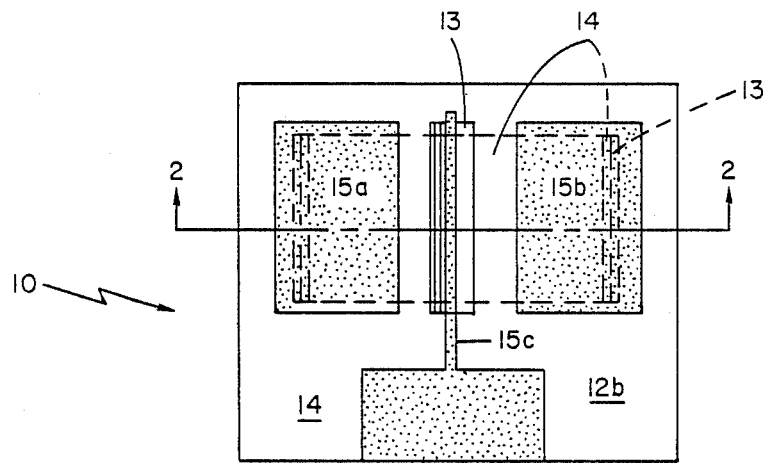
FIG. 2 is a plan view of a field effect transistor fabricated in accordance with the present invention.
Figure 3:
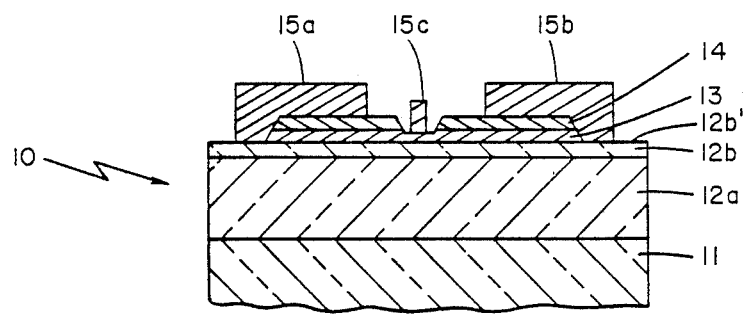
FIG. 3 is a cross-sectional view taken along lines 3—3 of FIG. 2.

Referring now to FIGS. 2 and 3, a semiconductor device, here a field effect transistor 10 fabricated in accordance with the present invention, is shown to include a substrate 11, here comprising gallium arsenide or other suitable Group III-V semiconductor material. Disposed over said substrate 11 are a plurality of sequentially, vapor phase, epitaxially deposited layers, here a buffer layer 12a, a buffer layer 12b, an active layer 13 and a contact layer 14. Here each one of said layers 12a, 12b, 13 and 14 are also comprised of gallium arsenide or other suitable Group III-V semiconductor material. A drain electrode 15a, a source electrode 15b and a gate electrode 15c are provided over contact layer 14 and active layer 13, as shown.

Figure 4:
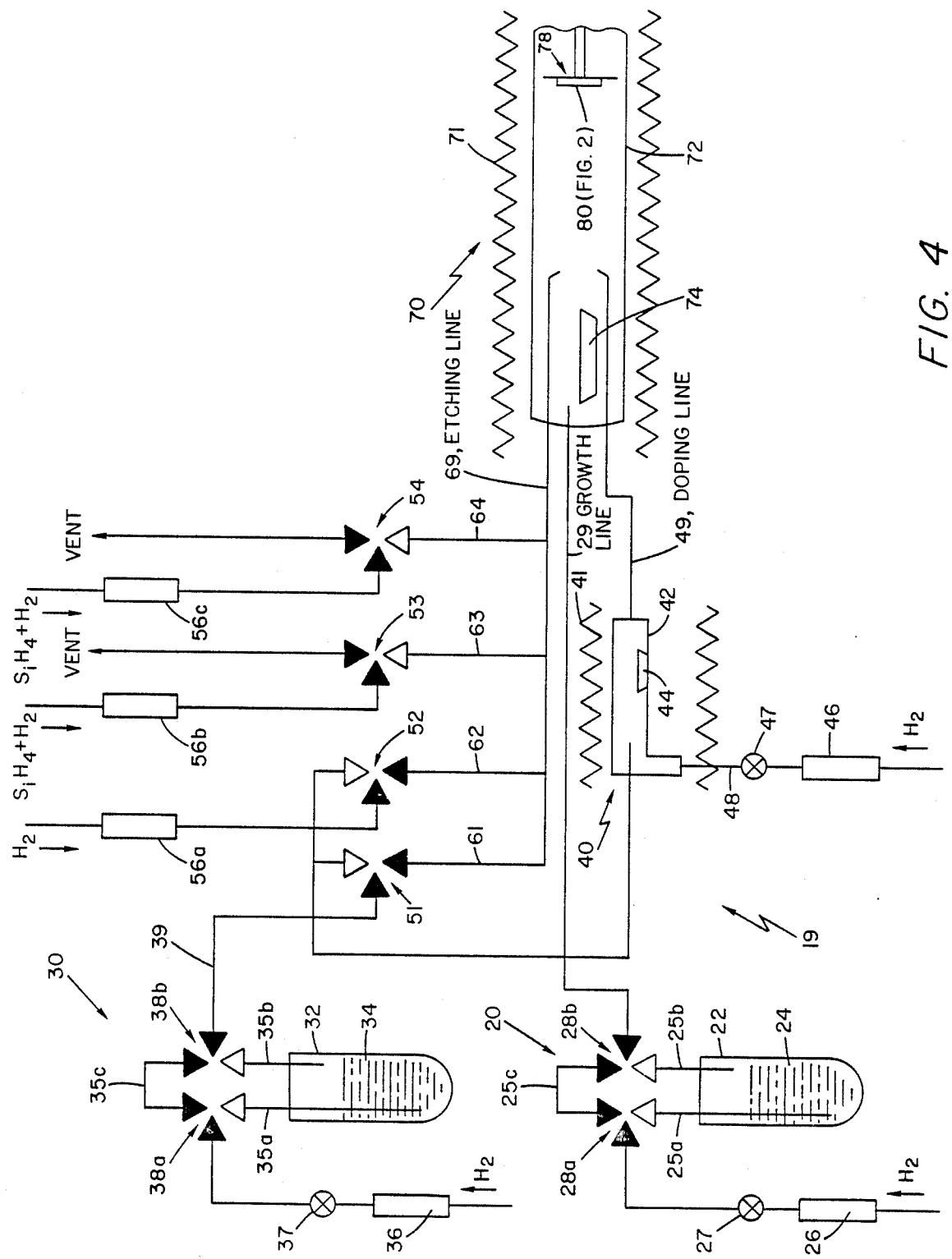
FIG. 4 is a schematic representation of an apparatus used to grow doped buffer layers in accordance with the present invention.

Buffer layer 12a here is a chromium doped high resistivity buffer layer. Buffer layer 12a has a resistivity of generally $10^7$–$10^8$ ohm-cm and a substantially constant concentration of chromium as a function of thickness of the layer, typically in the range of $5 \times 10^{15}$ to $5 \times 10^{16}$ atoms/cc. Buffer layer 12a is here grown to a thickness of at least 2 microns and preferably between 5 and 30 microns. After buffer layer 12a is grown to a predetermined thickness of about 6 microns as shown in FIG. 4, the concentration of chromium dopant introduced into a growth apparatus used to grow the layers is selected to monotonically decline as growth of the epitaxial buffer layer continues. Therefore, the second buffer layer 12b is grown having a thickness generally in the range of 1–3 microns with a monotonically declining concentration of chromium dopant introduced into said layer as a function of thickness. An upper surface portion 12b' of the buffer layer 12b is provided having a surface which is substantially semi-insulating having a resistivity in the range of about $10^5$ to $5 \times 10^5$ ohm-cm, but is substantially depleted of chromium dopant having a concentration of less than about $10^{14}$ atoms/cc. The buffer layer 12a has a high resistivity typically in the order of $10^7$–$10^8$ ohm-cm and substantially perfect crystalline structure. The buffer layer 12a therefore isolates the remaining epitaxial layers of the field effect transistor from crystalline imperfections and impurities generally found within the gallium arsenide substrate 11. The buffer layer 12b, being substantially depleted of the deep level acceptor chromium, reduces the deep level acceptor ionization problems which generally occur in response to an electron current flux generated during operation of conventional semiconductor field effect transistors having conventional highly doped Cr buffer layers. The thin uncompensated buffer layer 12b further acts as a diffusion shield for the relatively slow diffusing chromium ion, thereby substantially preventing the chromium from diffusing into active regions 13 of the field effect transistor 10.

Figure 5:
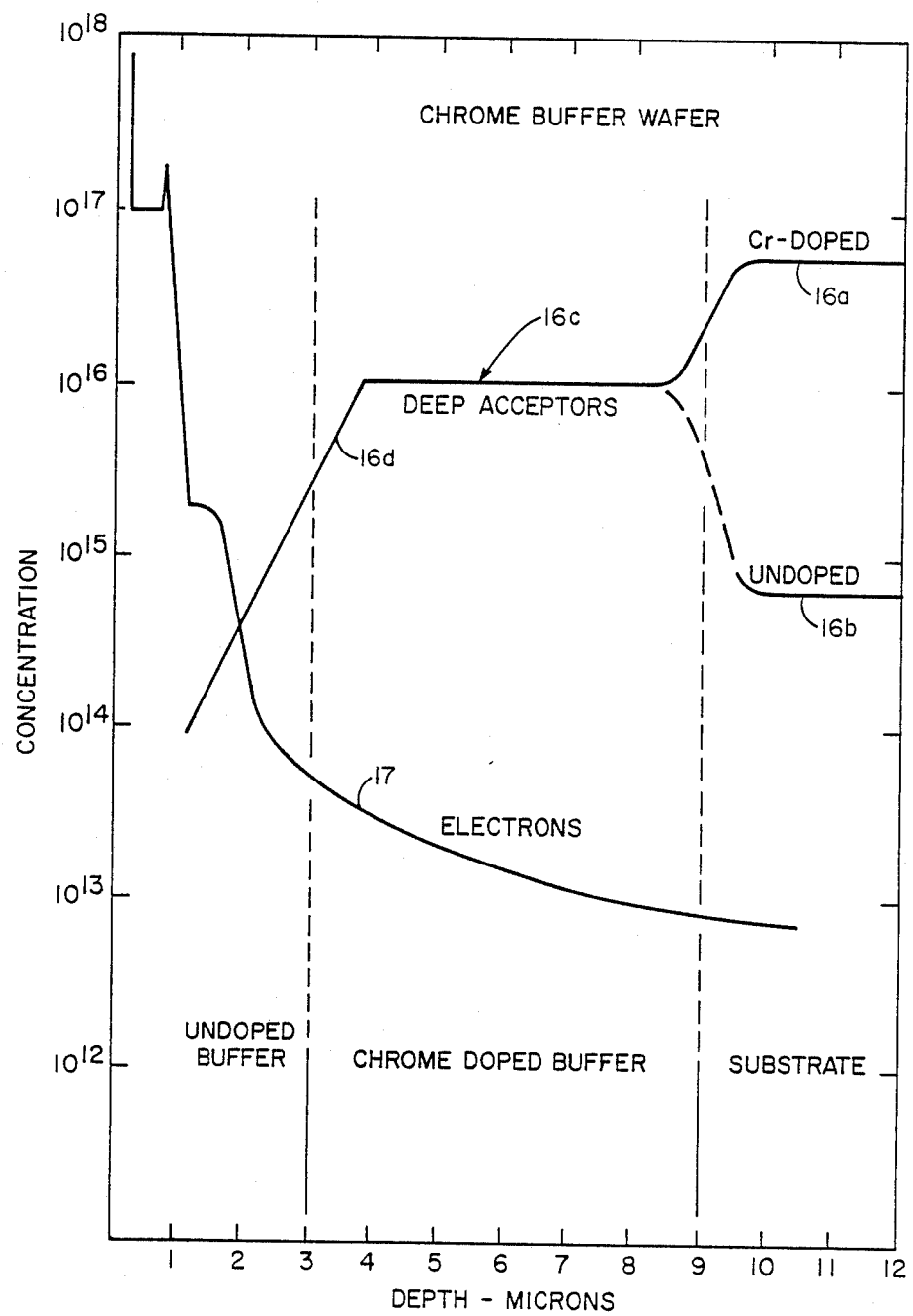
FIG. 5 is a typical plot of dopant concentration vs. thickness.

Referring now to FIG. 5, a doping density profile for the field effect transistor 10 is shown. The Cr doping profile curve 16 is divided into three regions. The substrate region generally has a dopant concentration for Cr of about $4 \times 10^{16}$ to $10^{17}$ atoms/cc if the substrate is Cr compensated, as for curve portion 16a. If the substrate is uncompensated, the doping level of Cr is typically less than $10^{15}$ atoms/cc, as for curve portion 16b. In any event, buffer layer 12a is grown, as mentioned, to have a thickness of between 2 and 30 microns, preferably, between 5 and 30 microns. Substantially throughout the buffer layer 12a, the dopant concentration of Cr is maintained substantially constant at about $10^{16}$ atoms/cc, as shown, for curve portion 16c. The second buffer layer 12b is then grown over buffer layer 12a having a Cr concentration which monotonically declines through the range of about here $5 \times 10^{15}$ to $10^{14}$ atoms/cc as for curve portion 16d. In buffer layers 12a, 12b, the electron concentration (curve 17) is generally kept less than about $10^{15}$ atoms/cc. The electron concentration is then increased to $10^{17}$ atoms/cc and to $10^{18}$ atoms/cc for the active and contact regions, respectively, as is known in the art. With this arrangement, the intermediate buffer layer 12b acts as a shield for the active layer 13 from the Cr doped buffer layer 12a and substrate 11 and provides a region substantially free from deep level acceptors upon which to grow the active layers 13.

Referring now to FIG. 4, a schematic representation of an opened tube vapor phase epitaxial apparatus 18 used to provide compensated doped buffer layers 12a and 12b is shown to include a vapor apparatus 19 and reactor apparatus 70. The vapor apparatus 19 is shown to include bubbler apparatus 20 and 30, and an independent retort system 40 having disposed therein a boat 44 containing a dopant source intermixed with a solid source of the material to be epitaxially grown. Suffice it to say that vapor apparatus 19 provides a "growth line" 29, a "compensation doping line" 49 and an "etching and doping line" 69 into a quartz or fused silica reaction tube 72 of reactor apparatus 70. Disposed in the reaction tube 72 is a fused silica boat 74, here containing a source, more preferably, a solid source of the epitaxial material to be grown. Here said boat 74 contains a solid source of gallium arsenide.

Tube 29 "the growth line" is fed from a solenoid actuated flow control valve 28b. Shaded ports (not numbered) of all solenoid valves show normally deactivated gas flow. In the normally deactivated state of solenoid control valve 28b and a solenoid control valve 28a, hydrogen gas is passed from a hydrogen source (not shown), via a flow regulator 26 and valve 27, to solenoid control valve 28a and to solenoid control valve 28b via tube 25c. The hydrogen gas, therefore, emerges from valve 28b and is fed to tube 29 the "growth line", to purge the furnace tube 72 of atmospheric gases. During growth of the gallium arsenide over the substrate 11, valves 28a and 28b are placed in their activated state enabling hydrogen gas to pass through tube 25a into a bubbler 22 which contains liquid arsenic trichloride 24 ($AsCl_3$). The liquid arsenic trichloride 24 ($AsCl_3$) within bubbler 22 is maintained at a constant temperature typically in the range of 0°–20° C., for example, by a constantly circulating coolant fluid (not shown) circulated into cooling jackets (not shown) which surround bubbler 22. The hydrogen gas is bubbled through the arsenic trichloride 24 and picks up molecules of arsenic trichloride. A mixture of hydrogen gas and arsenic trichloride emerges from bubbler 22, via tube 25b, and is fed to solenoid control valve 28b. Emerging therefrom via tube 29 is the mixture of hydrogen and arsenic trichloride. Tube 29 feeds the vapor flow of hydrogen and arsenic trichloride to reaction tube 72 upstream from the boat 74 of gallium arsenide.

Tube 69 "the etching line" is fed from a plurality of here four lines 61–64 which are, in turn, fed from solenoid control valves 51–54, respectively. Solenoid control valve 51 is fed from the etching bubbler apparatus 30 which provides a flow to etch substrate 11 during a substrate etching mode of operation and a flow to etch the dopant source 44 in retort system 40 in a compensating doping mode of operation. Solenoid valve 52 is fed from a hydrogen source which in the Cr doping mode provides a hydrogen carrier gas for the etching line 69 and in the etching mode provides hydrogen gas for a doping source etching line 43 as to be described. Solenoid control valves 53 and 54 are used to provide sources of ($SiH_4 + H_2$) for doping of active layers (FIGS. 2, 3) as will be described. Line 39 which feeds solenoid control valve 51 is fed from a solenoid actuated flow control valve 38b. In the normally deactivated state of solenoid control valve 38b and a solenoid control valve 38a, hydrogen gas is passed via a hydrogen source (not shown) through a flow regulator 36 and valve 37 to solenoid control valve 38a and to solenoid control valve 38b, via tube 35c. The hydrogen gas, therefore, emerges from valve 38b and is fed through tube 39, valve 51 and tube 69 to purge the reactor tube 72 of atmospheric gases. During etching of the substrate 11 prior to epitaxial growth of the gallium arsenide over the substrate 11, valves 38a and 38b are placed in their activated state enabling hydrogen gas to pass through tube 35a into a bubbler 32 which contains the liquid arsenic trichloride 34 ($AsCl_3$). The liquid arsenic trichloride $AsCl_3$ within bubbler 32 is maintained at a constant temperature in the range of 0°–20° C., for example, by a constantly circulating coolant fluid (not shown) circulated into cooling jackets (not shown) which surround bubbler 32. The hydrogen gas is bubbled through the arsenic trichloride and picks up molecules of arsenic trichloride. A mixture of hydrogen gas and arsenic trichloride emerges from bubbler 32, via tube 35b, and is fed to solenoid control valve 38b. Emerging therefrom via tube 39 is the mixture of hydrogen and arsenic trichloride. Tube 39 feeds deactivated solenoid control valve 51 and, hence, tubes 61 and 69 to provide the vapor flow of hydrogen and arsenic trichloride into reaction tube 72 downstream from the boat 74 containing the gallium arsenide.

Tube 49 "the doping line" is fed from a retort system 40. Retort system 40 includes a resistive-type retort heater 41 within which is disposed a retort tube 42 comprised of silica or fused quartz. Disposed within retort tube 42 is a boat comprised of fused silica containing a source of doping material here said source comprises chromium crystals and gallium arsenide crystals. The material within retort tube 42 is at an elevated temperature in the range of about 800° C. to 850° C., preferably at 820° C., but may be adjusted during growth of layers 12a, 12b. The ratio by volume of chromium to gallium arsenide crystals is about 50%/50%. The actual ratio of GaAs to Cr is not crucial. However, it is important to provide sources of these materials having large surface areas to insure that the reactions proceed efficiently. The only critical constraint on ratio between the dopant source and crystalline material source is that neither source of material be allowed to be exhausted during growth of the Cr doped layers. The retort tube 42 is fed by a first line 48 which is fed hydrogen via a flow regulator 46 and a valve 47. The retort tube 42 is fed, via a second line 43 "the doping source etch line", which is fed via solenoid valves 51 and 52. During growth of chromium doped buffer layers, the solenoid control valves 38a. and 38b are activated enabling hydrogen gas to pass through regulator 36 to solenoid valve 38a and into bubbler 32 via tube 35a. As previously described, the hydrogen bubbles through the liquid arsenic trichloride in bubbler 32 and emerges from bubbler 32 via line 35b feeding solenoid control valve 38b. Emerging from solenoid control valve 38b via line 39 is the mixed flow of hydrogen and arsenic trichloride. However, solenoid control valve 51 is activated enabling the mixed flow of hydrogen and arsenic trichloride to pass through solenoid control valve 51 to doing source etch line 43. Concomitantly, the solenoid control valve 52 is deactivated enabling a flow of hydrogen gas to flow through tube 69 thereby increasing the flow of hydrogen gas in the reactor tube 72. As previously mentioned, tube 43 delivers the arsenic trichloride and hydrogen vapor flow into retort 42. The arsenic trichloride and hydrogen are fed into the retort 42 and decomposed in accordance with reaction (1):

$$2AsCl_3 + 3H_2 \rightarrow 6HCl + \tfrac{1}{2}As_4 \qquad (1)$$

In retort 42, the reaction products (HCl and As₄) of reaction (1) react with the chromium and gallium arsenide provided in the boat 44 in retort tube 42 according to reactions (2A) and (3A):

$$Cr + 2HCl \rightarrow CrCl_2 + H_2 \qquad (2A)$$

$$GaAs + 2HCl \rightarrow GaCl_x + \tfrac{1}{4}As_4 + H_2 \qquad (3A)$$

where x is generally 1, 2, 3 and/or 4. Thus, a composite vapor stream comprising the dopant precursor $CrCl_2$, and GaAs components $As_4$ and $GaCl_x$, is transported into the reaction tube 72, emerging downstream from the gallium arsenide source 74.

Figure 1:
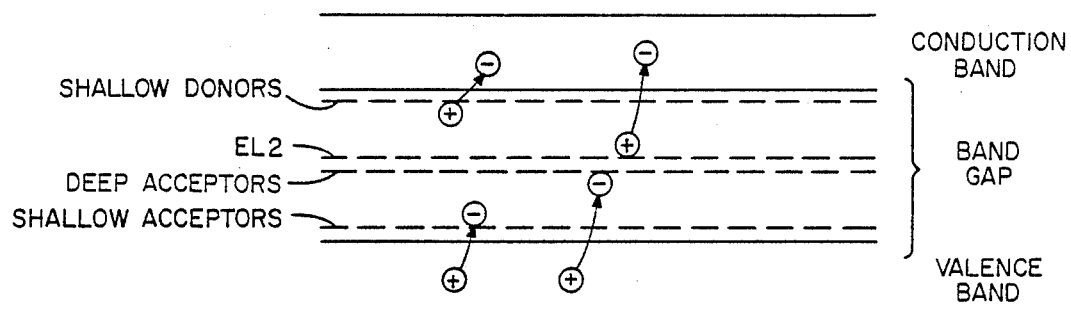
FIG. 1 is a diagrammatical representation of a band energy diagram for a GaAs crystal having electron energy levels resulting from stoichiometric crystalline defects and electron energy levels resulting from dopants introduced into the crystal.

The epitaxial reactor apparatus 70 is shown to further include a multiple zone furnace 71 within which is disposed the fused silica or quartz furnace tube 72. The substrate 11, here comprised of gallium arsenide or other suitable Group III-V semiconductor material or other suitable semiconductor material is disposed within the furnace tube 72 upon a support member 78. Here the support member 78 is also comprised of fused silica or quartz and is orientated perpendicularly to the center axis of the furnace tube 72, as shown. The substrate 11 is here a bulk gallium arsenide substrate upon which is to be sequentially epitaxially grown the semiinsulating buffer layers 12a, 12b, an active layer 13, and a contact layer 14 of the field effect transistor 10 (FIG. 1).

In operation, after the substrate 11 and the boat 74 comprising gallium arsenide are placed in the reaction tube 72, the reaction tube 72 is purged of atmospheric gases by the introduction of hydrogen, via lines 29, 49 and 69. The temperature within the multiple temperature zone furnace 71 is then raised to provide a predetermined desired temperature profile, with the substrate 11 being held at a temperature of 760° C. and the boat 74 containing the source of gallium arsenide being held at a temperature of 820° C., for example. Other temperature profiles for the substrate 11 and the boat 74 may alternatively be used to obtain a desired growth rate. Furthermore, two intermediate temperature zones are provided between the gallium arsenide source and boat 74 and the substrate 11 to provide an approximately linearly declining temperature between the source 74 and the substrate 11. The outwardly exposed surfaces of substrate 11 and the material in boat 74 are cleaned and etched away before growth of the sequential epitaxial layers 12a, 12b, 13 and 14 (FIG. 2) is initiated. When a stable temperature has been reached, valves 28a, 28b and 38a, 38b are activated enabling a mixture of hydrogen and arsenic trichloride to emerge from tubes 29 and 39. Valve 51 is deactivated enabling the mixture of arsenic trichloride and hydrogen from tube 39 to emerge via tube 61 and to feed tube 69. Thus, mixtures of hydrogen and arsenic trichloride emerge from tubes 29 and 69. The gaseous hydrogen and arsenic trichloride in each flow are at a desired reaction temperature and will decompose into gaseous arsenic and gaseous hydrogen chloride in accordance with reaction (1):

$$3H_2 + 2AsCl_3 \rightarrow \tfrac{1}{2}As_4 + 6HCl \qquad (1)$$
(gas) \qquad (gas) \qquad (gas)

The gaseous hydrogen chloride etches the surface of the substrate 11 and the surface of the gallium arsenide in boat 74 thereby freeing each from contaminants. After the surface of substrate 11 and the surface of the gallium arsenide in boat 74 have been etched and cleaned, the buffer layer 12a is epitaxially grown over substrate 11 as will now be described.

The buffer layer 12a is grown over substrate 11 as follows. Valves 38a, 38b and 51, are placed in their activated state, thereby enabling a mixture of arsenic trichloride and hydrogen to emerge from tube 39 and to feed tube 43. Valves 28a and 28b are placed in their activated state enabling arsenic trichloride vapors to emerge via tube 29, "the growth line". As previously mentioned, the arsenic trichloride which emerges from tube 43 reacts in accordance with reaction (1):

$$2AsCl_3 + 3H_2 \rightarrow 6HCl + \tfrac{1}{2}As_4 \qquad (1)$$

and provides gaseous HCl which reacts with the chromium and gallium arsenide in the retort source 44 in accordance with reactions (2A) and (3A) over the preferred temperature ranges specified:

$$800°\,C. < T < 850°\,C. \qquad (2A)$$
$$Cr + 2HCl \rightarrow CrCl_2 + H_2$$

$$800°\,C. < T < 850°\,C. \qquad (3A)$$
$$GaAs + 2HCl \rightarrow GaCl_x + \tfrac{1}{4}As_4 + H_2$$

where x is generally 1, 2, 3 and/or 4. Therefore, emerging from doping line 49 is a first flow comprising chromium chloride ($CrCl_2$), arsenic ($As_4$) and gallium chloride ($GaCl_x$).

Emerging from growth line 29 is arsenic trichloride ($AsCl_3$) and hydrogen ($H_2$) which react with the gallium arsenide (GaAs) in boat 74 in accordance with the following reactions:

$$AsCl_3 + H_2 \rightarrow HCl + \tfrac{1}{2}As_4 \qquad (1)$$

$$GaAs + 2HCl \rightarrow GaCl_3 + H_2\tfrac{1}{4}As_4 \qquad (3A)$$

The gaseous hydrogen chloride etches the surface of the solid gallium arsenide source in boat 74 producing a second flow comprising gaseous gallium trichloride and gaseous arsenic.

The gaseous gallium chloride and arsenic vapors are transported towards the substrate 11. Similarly, the first flow comprising the gaseous gallium chloride, the gaseous arsenic and the gaseous chromium chloride emerge from tube 49 and mix with the aforementioned second flow. This mixed composite flow is transported towards the substrate 11 where it is cooled due to the temperature difference in the multiple zone furnace. As a result of this cooling, gallium arsenide having a predetermined controlled concentration of chromium is condensed out of the vapor stream in accordance with reactions (3B) and (4):

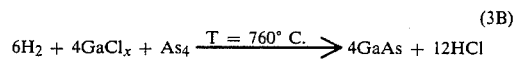

(3B)

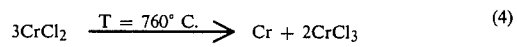

(4)

The chromium is introduced into the buffer layer 12a in a controlled manner, since the concentration of $CrCl_2$ is controlled independently of the concentration of the $GaCl_x$ and $As_4$ provided from the GaAs source 74. Further, the temperature of the retort may be manipulated preferably within the range of 800° C. to 850° C. to control the concentration and indeed modulate the concentration of Cr in the crystalline GaAs layer without changing the growth temperature of the GaAs crystalline layer or the GaAs source 74 and hence the rate of growth of the GaAs crystalline layers. Accordingly, by proper selection of flow rates through the retort 40 and temperature of the retort 40, the concentration of Cr in layers 12a and 12b can be controlled to provide the doping profile shown in FIG. 3.

After growth of buffer layer 12a, solenoid control valves 51 can be deactivated 52 activated and retort heater 41 cooled down to inhibit the Cr vapor from retort 42. However, valves 38a, 38b are deactivated enabling a flow of $H_2$ to be fed through tube 69. Growth of GaAs continues uninterrupted. The second buffer layer 12b is grown to a thickness of 1-2 microns over buffer layer 12a as the Cr concentration in the vapor stream through doping line 49 is linearly decreased. Also, during this growth any residual Cr dopant in the reactor tube 72 will be incorporated in the buffer layer 12b. Typically, buffer layer 12b is grown until the concentration of Cr dopant present in the upper surface 12b' is about $10^{14}$ atoms/cc. This buffer layer 12b provides a shielding layer for subsequently deposited active layer 13 to shield active layer 13 from the electric field associated with the ionization of the deep acceptor chromium which often occurs in the presence of a large electron current flux.

After growth of buffer layer 12b, valves 38a and 38b are placed in their deactivated state providing an $H_2$ flow through tube 69 and valves 28a and 28b are activated again enabling a flow of arsenic trichloride through growth line 29. Concomitantly therewith, valve 53 is placed in its activated state enabling a first predetermined flow of silane and hydrogen ($SiH_4 + H_2$) to flow through flow controller 56b to etching and doping line 69, via line 63. As gallium arsenide is epitaxially grown on the surface of the buffer layer, an n-type dopant material, here silicon provided by the silane gas, is controllably introduced as a dopant material for growing the gallium arsenide n doped active region to provide an n-type dopant concentration of $5 \times 10^{16}$ atoms/cc to $4 \times 10^{17}$ atoms/cc.

After active layer 13 is grown to a predetermined thickness, the contact layer 14 is grown. The contact layer is here a conventional n+type contact layer and is grown in a similar manner as described above for n-type active layer 16 except that the concentration of silane gas introduced is increased to here 100 parts per million and is introduced from lines 69 and 64 via the flow regulator 56c of solenoid control valve 64 to provide an n-type dopant concentration of at least $10^{18}$ atoms/cc.

Having described preferred embodiments of the invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A semiconductor comprising:
    a gallium arsenide substrate having a resistivity of about $10^7$ ohm-cm;
    a gallium arsenide first buffer layer having a resistivity of at least about $10^7$ ohm-cm and a thickness of at least 6 microns disposed over the substrate having a deep level compensating dopant material incorporated into said gallium arsenide first buffer layer to provide said gallium arsenide first buffer layer with the resistivity characteristic of at least about $10^7$ ohm-cm, with the concentration of said dopant being substantially constant as a function of thickness of said layer;
    a second buffer layer of gallium arsenide having a resistivity in the range of about $10^5$ to $5 \times 10^5$ ohm-cm disposed over said first buffer layer having a monotonically declining dopant concentration of said compensating dopant and a thickness in the range of about 1 micron to 2 microns; and
    means, including at least a third layer of n-type gallium arsenide for providing a semiconductor device, said means being disposed over at least a portion of said second buffer layer.

2. The semiconductor device of claim 1 wherein said means further comprises:
    an n-type gallium arsenide active region having an n-type dopant concentration in the range of $5 \times 10^{16}$ electtons/cc to $4 \times 10^{17}$ electrons/cc;
    an n-type gallium arsenide contact layer disposed over a portion of said active layer having an n-type dopant concentration of at least $8 \times 10^{17}$ electrons/cc; and
    drain and source electrodes in ohmic contact with said contact layer and a gate electrode disposed over said active region to control the conductivity of said active region between said drain and source electrodes.

3. A field effect transistor comprising:
    a gallium arsenide substrate;
    a first gallium arsenide buffer crystalline layer disposed over said substrate having a resistivity of about $10^7$ ohm-cm, and dopant with a predetermined concentration of chromium, said chromium concentration being in the range of $5 \times 10^{15}$ to $5 \times 10^{16}$ acceptors/cc;
    a second gallium arsenide crystalline layer disposed over said first gallium arsenide crystalline layer having a resistivity of about $10^5$ ohm-cm and a thickness of 1 to 2 microns having chromium as a dopant, said chromium concentration being in the range of $10^{14}$ to $5 \times 10^{15}$ acceptors/cc; and
    means, including at least a third layer of crystalline gallium arsenide, for providing the field effect transistor, said means being disposed over at least a portion of said second gallium arsenide crystalline layer.

4. The field effect transistor of claim 3 wherein the chromium concentration monotonically declines through the thickness of said second gallium arsenide layer from about $5 \times 10^{15}$ atoms/cc adjacent said first gallium arsenide buffer crystalline layer to less than about $10^{14}$ atoms/cc adjacent said third layer.

5. A field effect transistor comprising:
   a substrate of gallium arsenide having a resistivity of at least about $10^7$ ohm-cm;
   a first layer of gallium arsenide disposed over said substrate comprising a deep level acceptor dopant incorporated into said layer to compensate for donor dopants incorporated into said layer, a first portion of said layer having the concentration of said deep level acceptors being substantially constant at about $10^{16}$ acceptors/cc adjacent substrate and having a first predetermined resistivity characteristic of about $10^7$ ohm-cm, and a second portion of said layer having a concentration of deep level acceptors monotonically declining to a value less than about $10^{14}$ acceptors/cc and having a second predetermined resistivity characteristic of at least about $10^5$ ohm-cm; and
   means for providing the field effect transistor comprising a layer of gallium arsenide disposed over at least a portion of said second portion of said first layer of gallium arsenide.

6. The transistor of claim 5 wherein said deep level acceptor dopant is chromium.

7. The transistor of claim 1 wherein said deep level compensating dopant is chromium.

* * * * *

UNITED STATES PATENT AND TRADEMARK OFFICE
CERTIFICATE OF CORRECTION

PATENT NO. : 4,745,448
DATED : May 17, 1988
INVENTOR(S) : Van Rees et al.

It is certified that error appears in the above-identified patent and that said Letters Patent is hereby corrected as shown below:

Column 4, line 61, delete "$4 \times 10^{16}$" and replace with --$5 \times 10^{16}$--.

Column 7, line 7, delete "doing" and replace with --doping--.

Column 8, line 55, delete "$GaAs + 2HCl \longrightarrow GaCl_3 + H_2\ 1/4\ As_4$" and replace with --$GaAs + 2HCl \longrightarrow GaCl_3 + H_2 + 1/4\ As_4$--.

Signed and Sealed this

Twenty-fifth Day of October, 1988

Attest:

DONALD J. QUIGG

Attesting Officer

Commissioner of Patents and Trademarks